United States Patent [19]

Smith et al.

[11] Patent Number: 5,668,836
[45] Date of Patent: Sep. 16, 1997

[54] SPLIT FREQUENCY BAND SIGNAL DIGITIZER AND METHOD

[75] Inventors: Paul Fielding Smith, North Richland Hills; Danny Thomas Pinckley, Arlington, both of Tex.

[73] Assignee: Motorola, Inc., Schaumburg, Ill.

[21] Appl. No.: 366,347

[22] Filed: Dec. 29, 1994

[51] Int. Cl.$^6$ .............. H04L 5/06; H04B 1/26; H03M 1/12

[52] U.S. Cl. .......... 375/316; 455/131; 455/313; 341/155

[58] Field of Search .............. 375/316; 341/155; 455/313, 131

[56] References Cited

U.S. PATENT DOCUMENTS

| | | | |
|---|---|---|---|
| 3,609,555 | 9/1971 | Van Blerkom et al. | 341/155 |
| 3,991,277 | 11/1976 | Hirata | 370/70 |
| 4,101,738 | 7/1978 | Bellanger et al. | 370/70 |
| 4,112,374 | 9/1978 | Steinbrecher | 455/6.2 |
| 4,206,320 | 6/1980 | Keasler et al. | 370/11 |
| 4,230,956 | 10/1980 | Steinbrecher | 327/122 |
| 4,237,551 | 12/1980 | Narasimha | 370/50 |
| 4,355,405 | 10/1982 | Ruys et al. | 375/275 |
| 4,492,962 | 1/1985 | Hansen | 342/369 |
| 4,514,760 | 4/1985 | Balaban et al. | 348/484 |
| 4,517,586 | 5/1985 | Balaban et al. | 348/572 |
| 4,621,337 | 11/1986 | Cates et al. | 364/727 |
| 4,652,858 | 3/1987 | Kokubo et al. | 341/144 |
| 4,803,727 | 2/1989 | Holt et al. | 381/1 |
| 4,876,542 | 10/1989 | van Bavel et al. | 341/143 |
| 4,881,222 | 11/1989 | Goeckler et al. | 370/70 |
| 4,884,265 | 11/1989 | Schroeder et al. | 370/70 |
| 4,893,316 | 1/1990 | Janc et al. | 375/271 |
| 4,979,188 | 12/1990 | Kotzin et al. | 375/254 |
| 5,101,501 | 3/1992 | Gilhousen et al. | 455/33.2 |
| 5,103,459 | 4/1992 | Gilhousen et al. | 375/205 |
| 5,109,390 | 4/1992 | Gilhousen et al. | 375/205 |
| 5,136,612 | 8/1992 | Bi | 375/205 |
| 5,159,608 | 10/1992 | Falconer et al. | 375/200 |
| 5,170,413 | 12/1992 | Hess et al. | 375/260 |
| 5,187,809 | 2/1993 | Rich et al. | 455/33.1 |
| 5,224,122 | 6/1993 | Bruckert | 375/200 |
| 5,251,218 | 10/1993 | Stone et al. | 370/120 |
| 5,280,636 | 1/1994 | Kelley et al. | 455/313 |
| 5,293,329 | 3/1994 | Wishart et al. | 364/724.13 |
| 5,295,153 | 3/1994 | Gudmundson | 375/205 |
| 5,299,192 | 3/1994 | Guo et al. | 370/70 |
| 5,313,279 | 5/1994 | Wang et al. | 348/426 |
| 5,323,157 | 6/1994 | Ledzius et al. | 341/143 |
| 5,347,284 | 9/1994 | Volpi et al. | 342/356 |
| 5,387,913 | 2/1995 | Park et al. | 341/155 |
| 5,396,489 | 3/1995 | Harrison | 370/50 |
| 5,406,629 | 4/1995 | Harrison et al. | 380/34 |
| 5,410,569 | 4/1995 | Halozan | 375/316 |

FOREIGN PATENT DOCUMENTS

| | | | |
|---|---|---|---|
| 0529183 | 3/1993 | European Pat. Off. | 455/313 |
| 95/12261 | 5/1995 | WIPO . | |

OTHER PUBLICATIONS

Harris Semiconductor Digital Signal Processing Databook, "Numerically Controlled Oscillator/Modulator", HSP45116, pp. 5-26/5-40, Harris Corporation.

Fundamentals of Digital Image Processing by Anil K. Jain, University of California, Davis, 1989 by Prentice-Hall, Inc., pp. 155-159, 185-187.

(List continued on next page.)

*Primary Examiner*—Stephen Chin
*Assistant Examiner*—Jeffrey W. Gluck
*Attorney, Agent, or Firm*—Jeffrey G. Toler

[57] ABSTRACT

A split frequency band signal digitizer (10) includes a first mixer (18) for translating a split-band signal (200) about a multiple of the sampling frequency. The split-band signal so translated is then communicated to an analog-to-digital converter (26). The digitized signal is then analyzed to recover an original portion of the split-band signal and a second portion of the signal aliased into a single Nyquist band.

20 Claims, 2 Drawing Sheets

OTHER PUBLICATIONS

"Robust Digital Filter Structures", 7–3 Cascade Form Digital Filter Structures, Handbook for Digital Signal Processing by Sanjit Mitra and James Kaiser, John Wiley & Sons 1993.
Hogenauer, Eugene B. "An Economical Class of Digital Filters for Decimation and Interpolation", IEEE Transactions on Acoustics, Speech and Signal Processing, vol. ASSP–29, No. 2.

ETSI–SMG, GSM 06.31, 4.0.0, Discontinuous Transmission (DTX) for Full Rate Speech Transmission Channels, Oct. 1992.

ETSI–SMG, GSM 06.12, 4.0.1, Comfort Noise Aspects for Full Rate Speech Traffic Channels, Jan. 1993.

EIA/TIA/IS–95, Requirements for Base Station CDMA Operation, pp. 7–1/7–185, Appendix A Requirements for CDMA Service OptionsA–1/A–68.

SPLIT FREQUENCY BAND SIGNAL DIGITIZER AND METHOD

FIELD OF THE INVENTION

The present invention relates to multi-channel digital transceivers, and more particularly, to a split frequency band signal digitizer and a method of efficiently digitizing split frequency band signals.

BACKGROUND OF THE INVENTION

There are numerous advantages to implementing a radio communication system using digital techniques. Notably, there is enhanced system capacity, reduced noise, and reduced hardware and associated power consumption. There has been proposed several digital radio communication systems. For example, there is shown and described in the commonly assigned U.S. Patent Application entitled "Multi-Channel Digital Transceiver and Method", filed on even date herewith and of which the Applicants are co-inventors, several preferred embodiments of radio communication systems implementing digital techniques.

Fundamental to the digital radio communication system is the requirement that the received analog radio signal be digitized. The well known Nyquist criteria provides that such digitization is accomplished with minimal error using an analog-to-digital converter (ADC) with a sampling rate greater than twice the bandwidth of the analog signal. In U.S. Pat. No. 5,251,218 a methodology typical of the prior art is disclosed for digitizing an analog radio frequency signal. It will be appreciated, however, where the radio signal occupies a large bandwidth, ADCs capable of operation at very high sampling rates are required. Such devices, to the extent they are available, are expensive and often suffer reduced performance, i.e., have significant distortion and increased power consumption when operated at high sampling rates.

The spectrum allocated to radio communication systems is typically large with respect to the requirements for digitizing. In some radio communication systems, however, although the desired signal occupies a large bandwidth, not all of the bandwidth is occupied by signals of interest. In cellular radio telephone communication systems, for example, the communication bandwidth is not contiguous. When radio spectrum was initially allocated for cellular radio telephone communications, two contiguous 10 Megahertz (MHz) blocks of spectrum where allocated for "A-band" operators and "B-band" operators, respectively. However, as the need arose to enhance capacity of the cellular radio communication system, additional bandwidth was required. Unfortunately, large enough blocks of bandwidth adjacent the originally allocated blocks were not available. Hence, additional 2.5 MHz blocks of bandwidth were allocated. The resulting A-band is illustrated in FIG. 2A as an 11 MHz block and a 1.5 MHz block separated by a 10 MHz block occupied by the B-band. So, while the cellular A-band and B-band each have a bandwidth of 12.5 MHz, spectrally, the entire A-band covers 22.5 MHz of bandwidth in two discontinuous portions.

In order to digitize the A-band, for example, one would need an ADC capable of operating, according to the Nyquist criteria, at least at 45 Mhz or 45 million samples per second (Ms/s), and more reliably at 56 Ms/s. Splitting the signal into smaller segments allows the use of multiple ADCs at lower sampling rates. Using multiple ADCs has the disadvantage of requiring more hardware. Furthermore, clock frequency and higher order harmonics thereof inevitably fall into the frequency band of the signal being digitized. Still another disadvantage is the amount of digital data handling required to filter, interpolate, compensate for band overlap and sum the resulting multiple digital signals.

Therefore, there is a need for a device and method for digitizing split frequency band signals which does not require high sampling rates, and does not significantly increase the amount of hardware required for the communication system. Such a device and method are provided by the present invention, and one of ordinary skill in the art will readily appreciated the many advantages and features of the present invention from the following detailed description and accompanying drawings:

DETAILED DESCRIPTION OF A PREFERRED EMBODIMENT

Digitizing of a split frequency band analog signal is accomplished in the present invention with both reduced sampling frequency and hardware requirements. The present invention provides for mixing the entire split frequency bandwidth about a reference frequency which will allow for digitizing at a reduced sampling frequency. The reference frequency is chosen such that the segments of the split frequency bandwidth occupy adjacent aliasing bands. Digitizing at a reduced sampling frequency produces a digital signal with the entire split frequency band signal represented in a single Nyquist band of the sampling frequency.

Figure 1:
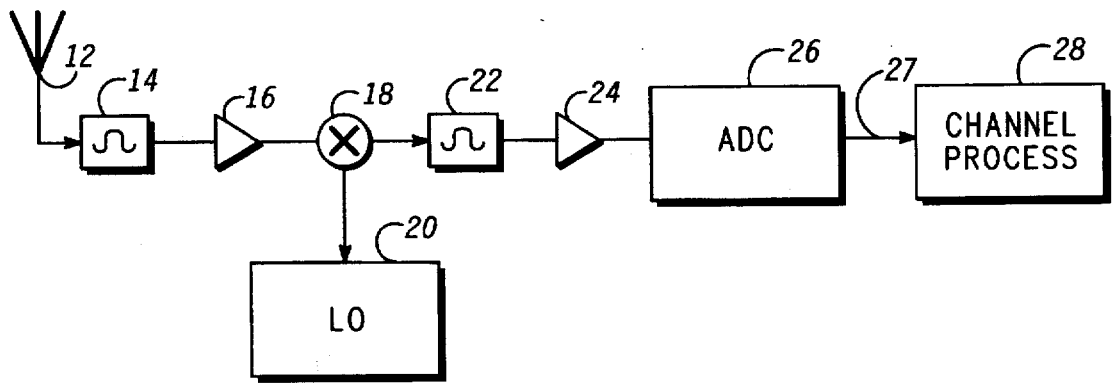
FIG. 1 is a block diagram representation of a split frequency band digitizer in accordance with a preferred embodiment of the present invention.

Referring to FIG. 1 a digital radio receiver 10 incorporating the digitizer of the present invention is shown. A split frequency band analog signal is received at antenna 12 and down mixed and signal conditioned through filter 14 and amplifier 16 as is well known in the art. The split frequency band signal is then communicated to mixer 18 where it is frequency translated by a signal from local oscillator 20.

Figure 2A:
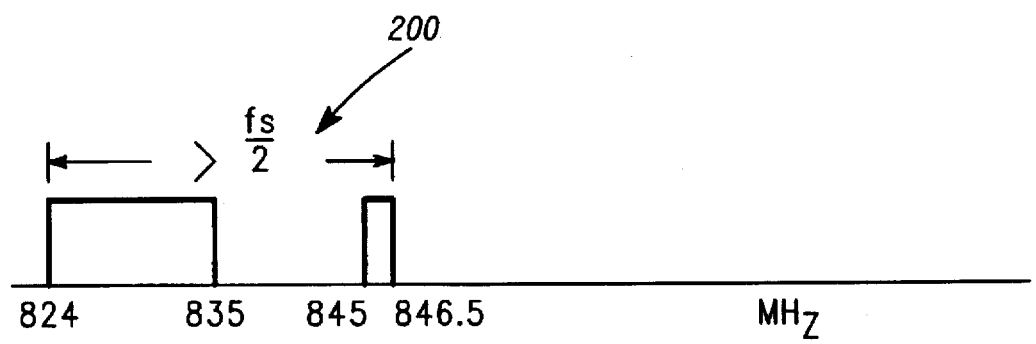
FIG. 2A is a spectral representation of a split frequency band signal.
Figure 2B:
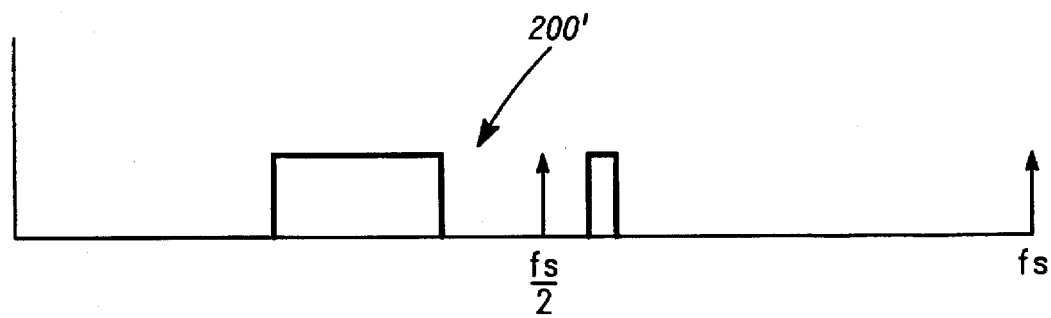
FIG. 2B is a spectral representation of the split frequency band signal shown in FIG. 2A after translation according to a preferred embodiment of the present invention.
Figure 2C:
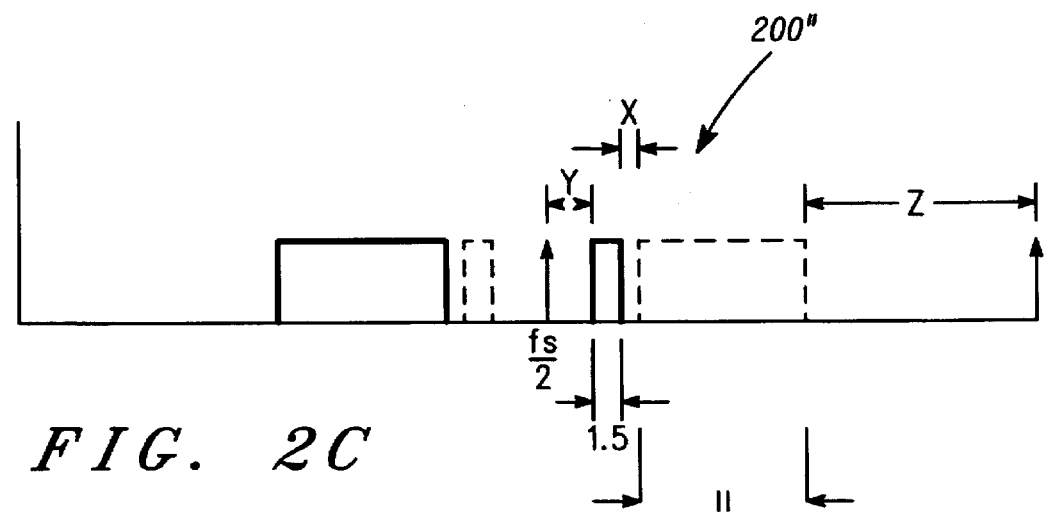
FIG. 2C is a spectral representation of the split frequency band signal shown in FIG. 2B after converting to a digital signal in accordance with a preferred embodiment of the present invention.

With reference to FIGS. 2A–2C, a split frequency band signal 200 is shown. Signal 200 is typical of that of the cellular A-band, however, it should be understood that the present invention is applicable to digitizing any type of split frequency band analog signal. The result of mixing signal 200 with the reference frequency in mixer 18 is signal 200′, FIG. 2B. As can be seen, after mixing, the split frequency band signal is translated such that the split segments of the signal 200′ lie about the reference frequency shown as $f_s/2$. It will be appreciated that an appropriate local oscillator frequency can be selected for either high side or low side injection, depending upon the split band frequency signal, to translate the signal about the reference signal.

Referring back to FIG. 1 the mixed split frequency band signal is further conditioned through filter 22 and amplifier 24. The translated split band frequency signal is then communicated to analog-to-digital converter (ADC) 26. Analog-to-digital converter 26 digitizes at a sampling rate $f_s$, in a known manner, the split frequency band analog signal to produce a digital signal 27. Digital signal 27 is represented in FIG. 2C as 200". As can be seen from FIG. 2C, digitizing signal 200' results in aliasing of the split band segments (shown in phantom) of signal 200', with the aliased segments contained within a Nyquist band of the sampling frequency, $f_s$.

In the preferred embodiment of the present invention, the sampling frequency, $fs$, is selected to be approximately 2.5 times the bandwidth of the wider segment of the split band frequency signal. The reference frequency is selected to be approximately half the sampling frequency or a multiple thereof. As will be appreciated, the entire split frequency band signal is digitized using a sampling rate which is less than twice the total spectral bandwidth of the split frequency band signal, e.g., as shown in FIG. 2A. With further reference to FIG. 2C a specific example of selecting the sampling frequency is shown for the cellular A-band. From the spectral chart shown, two observations can be made, first:

$$X+1.5+2Y=10 \quad (a)$$

and second:

$$Z+11+X+1.5+Y=fs/2 \quad (b)$$

from which it can be determined that:

$$fs=33.5+X+2Z \quad (c)$$

where X, Y and Z are as shown in FIG. 2C, and 11 MHz and 1.5 MHz are the bandwidths of the segments being digitized, respectively. This relationship is true regardless of the alias band being considered.

It can be seen from the above that $fs$ can approach 33.5 Ms/s as compared to 56 Ms/s which would otherwise be required to digitized the cellular A-band. In practical applications, $fs$ is dependent on filtering. That is, the X segment must be wide enough to allow an anti-aliasing filter to pass the 11 MHz band but attenuate the 1.5 MHz alias. The Z segment must be big enough such that, after mixing, the image that is generated by sampling can be filtered out. In practice, $fs$ can realistically approach 35 Ms/s.

The digital signal 200" is then communicated to channel processors 28. Channel processors operate on signal 200" to recover the digital representation of the entire split frequency band signal. A discussion of such channel processors can be found in the aforementioned U.S. Patent Application entitled "Multi-channel Digital Transceiver and Method". It should be noted that the digital representation of the signal, due to aliasing contains transposed segments of the split frequency band signal. It would, however, be within the skilled artisan's knowledge to properly reconstruct the split frequency band signal from these transposed segments.

Figure 3:
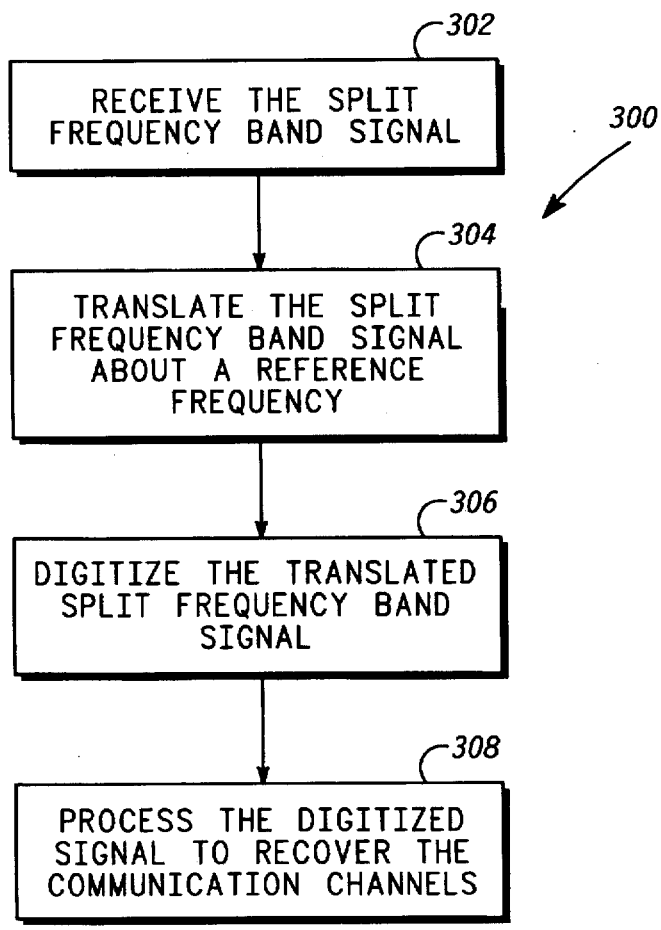
FIG. 3 is a flowchart illustrating a method of digitizing a split frequency band signal in accordance with a preferred embodiment of the present invention.

With reference then to FIG. 3, a method of digitizing a split frequency band signal in accordance with a preferred embodiment of the present invention is shown, 300–308. A split frequency band signal is received, 302, and is mixed 304 such that the translated split frequency band signal segments lie about a reference frequency. The mixed signal is then digitized, 306, producing a digital signal including aliases of the split frequency band signal. The mixed signal is digitized at a sampling rate which is less than twice the total bandwidth of the split frequency band signal. The split frequency band signal is then recovered from the digital signal in a channel processor card 308.

As one of ordinary skill the art will appreciated from the foregoing discussion, the present invention provides a digitizer and method which reduces sampling frequency and/or hardware requirements for digitizing a split frequency band signal. The many features, advantages and fair scope of the present invention is readily discerned from the foregoing discussion and the subjoined claims.

What is claimed is:

1. A split frequency signal digitizer comprising:

a first frequency translator coupled to receive an analog split frequency band signal, the analog split frequency band signal including a first segment having a first bandwidth and a second segment having a second bandwidth, the analog split frequency band signal having a total bandwidth greater than the sum of the first and second bandwidths, the frequency translator producing a frequency translated signal from the received signal, the frequency translated signal having substantially the same total bandwidth as the total bandwidth of the analog split frequency band signal;

an analog-to-digital converter responsive to the frequency translator, the analog-to-digital converter digitizing the frequency translated signal by sampling the frequency translated signal at a sampling rate less than twice the total bandwidth of the split frequency band signal to produce a digital signal, the digital signal including a digitized version of the first and second segments and aliased versions of the first and second segments.

2. The split frequency signal digitizer as in claim 1 further comprising a processor recovering a digital representation of the analog split frequency band signal from the digital signal.

3. The split frequency signal digitizer as in claim 1 wherein the first and second segments and at least one of the aliased versions of the first and second segments are all spectrally located within a bandwidth that is less than twice the total bandwidth of the analog split frequency band signal.

4. The split frequency signal digitizer as in claim 1 further comprising analysis means responsive to the analog-to-digital converter for receiving the digital signal and extracting a digital representation of the analog split frequency band signal.

5. A method of digitizing an analog split frequency band signal comprising the steps of:

receiving an analog split frequency band signal, the analog split frequency band signal having a first segment with a first bandwidth, a second segment with a second bandwidth, and a total bandwidth greater than the sum of the first and second bandwidths;

frequency translating the received signal to produce a frequency translated signal, such that a reference frequency is located between frequencies associated with frequency translated versions of the first segment and the second segment in the frequency translated signal; and digitizing the frequency translated signal by sampling the frequency translated signal at a sampling rate less than twice the total bandwidth of the analog split frequency band signal to produce a digital signal, the digital signal including a digital representation of the first and second segments and aliased versions of the first and second segments.

6. The method of digitizing an analog split frequency band signal as in claim 5 wherein the digital representation of the first and second segments and at least one of the aliased versions of the first and second segments are located within a bandwidth that is less than twice the total bandwidth of the split frequency band signal.

7. The method of digitizing an analog split frequency band signal as in claim 5 wherein the reference frequency is about one half of the sampling rate.

8. The method of digitizing an analog split frequency band signal as in claim 7 wherein at least one of the aliased versions of one of the first and second segments is contained within a Nyquist band based on the sampling rate.

9. The method of digitizing an analog split frequency band signal as in claim 5 wherein the step of frequency translating the analog split frequency band signal comprises translating the analog split frequency band signal about an integer multiple of a Nyquist frequency of the analog split frequency band signal.

10. The method of digitizing an analog split frequency band signal as in claim 5 further comprising the step of extracting from the digital signal a digital representation of the analog split frequency band signal.

11. A split frequency band signal digitizer comprising:

means for receiving a split frequency band signal, the split frequency band signal having a first segment with a first bandwidth, a second segment with a second bandwidth, and a total bandwidth greater than the sum of the first and second bandwidths;

means for mixing the received signal to produce a frequency translated signal, the frequency translated signal having a total bandwidth substantially the same as the total bandwidth of the split frequency band signal; and means for digitizing the frequency translated signal by sampling the frequency translated signal at a sampling rate less than twice the total bandwidth of the split frequency band signal to produce a digital signal, the digital signal including aliased versions of the first and second segments of the split frequency band signal.

12. The digitizer of claim 11 wherein the digital signal further includes a digital representation of the first and second segments, and at least one of the aliased versions of one of the first and second segments of the digital signal is located within a bandwidth that is less than twice the total bandwidth of the split frequency band signal.

13. The digitizer of claim 11 wherein the frequency translated signal has been translated about a reference frequency that is about one half of the sampling rate.

14. The digitizer of claim 11, wherein at least one of the aliased versions of the first segment and a digitized version of the second segment are contained within a Nyquist band associated with the sampling rate.

15. The digitizer of claim 11 wherein the means for mixing comprises means for translating the analog split frequency band signal about an integer multiple of a Nyquist frequency of the split frequency band signal.

16. The digitizer of claim 11 further comprising means for extracting from the digital signal a digital representation of the split frequency band signal.

17. A digital receiver comprising:

a receiver detecting an analog split frequency signal including a first segment having a first bandwidth and a second segment having a second bandwidth, the analog split frequency signal having a total bandwidth greater than the sum of the first and second bandwidths; and an analog-to-digital converter responsive to the receiver, the analog-to-digital converter digitizing the analog split frequency signal detected by the receiver by sampling the analog split frequency signal at a sampling rate less than twice the total bandwidth of the analog split frequency signal to produce a digital signal, the digital signal including a digitized version of the first and second segments and aliased versions of the first and second segments.

18. The digital receiver of claim 17 further comprising a processor recovering a digital representation of the analog split frequency signal from the digital signal.

19. The digital receiver of claim 17 further comprising analysis means responsive to the analog-to-digital converter for receiving the digital signal and for extracting a digital representation of the analog split frequency signal.

20. The digital receiver of claim 17, wherein the first and second segments and the aliased versions of the first and second segments are all spectrally located within a bandwidth that is less than twice the total bandwidth of the analog split frequency signal.

* * * * *